(12) United States Patent
Rudolph et al.

(10) Patent No.: US 10,689,305 B2
(45) Date of Patent: Jun. 23, 2020

(54) SYSTEMS AND METHODS FOR PRODUCING A CARBON COMPOSITE MATERIAL

(71) Applicant: Goodrich Corporation, Charlotte, NC (US)

(72) Inventors: James Warren Rudolph, Colorado Springs, CO (US); John Linck, Pueblo, CO (US)

(73) Assignee: GOODRICH CORPORATION, Charlotte, NC (US)

( * ) Notice: Subject to any disclaimer, the term of this patent is extended or adjusted under 35 U.S.C. 154(b) by 449 days.

(21) Appl. No.: 14/752,551

(22) Filed: Jun. 26, 2015

(65) Prior Publication Data

US 2016/0376203 A1 Dec. 29, 2016

(51) Int. Cl.
*B32B 9/00* (2006.01)
*C04B 41/50* (2006.01)
*C04B 35/83* (2006.01)
*C04B 35/626* (2006.01)
*C04B 35/52* (2006.01)
(Continued)

(52) U.S. Cl.
CPC ........ *C04B 41/5001* (2013.01); *C04B 35/521* (2013.01); *C04B 35/6267* (2013.01); *C04B 35/62675* (2013.01); *C04B 35/83* (2013.01); *C04B 41/0072* (2013.01); *F16D 65/12* (2013.01); *F16D 65/126* (2013.01); *C04B 2235/614* (2013.01);
(Continued)

(58) Field of Classification Search
CPC ........ C23C 16/26; B32B 9/007; Y10T 428/30
USPC ........................................ 428/408; 423/447.1
See application file for complete search history.

(56) References Cited

U.S. PATENT DOCUMENTS 7,335,397 B2   2/2008  Rudolph
8,057,855 B1   11/2011 Rudolph
(Continued)

FOREIGN PATENT DOCUMENTS

CN   100394060   6/2008
CN   101412632   7/2011
(Continued)

OTHER PUBLICATIONS

Extended European Search Report dated Nov. 7, 2016 in European Application No. 16176362.8.
(Continued)

*Primary Examiner* — Daniel H Miller
(74) *Attorney, Agent, or Firm* — Snell & Wilmer L.L.P.

(57) ABSTRACT

A carbon/carbon brake disk is provided. The carbon/carbon brake disk may comprise a carbon fiber, wherein the carbon fiber is formed into a fibrous network, wherein the fibrous network comprises carbon deposited therein. The carbon fiber may undergo a FHT process, wherein micro-cracks are disposed in the carbon fiber. In various embodiments, the micro-cracks may be at least partially filled with un-heat-treated carbon via a final CVD process, wherein the final CVD process is performed at a temperature in the range of up to about 1,000° C. (1,832° F.) for a duration in the range from about 20 hours to about 100 hours. In various embodiments, the un-heat-treated carbon may be configured to prevent oxygen, moisture, and/or oxidation protection systems (OPS) chemicals from penetrating the carbon/carbon brake disk. In various embodiments, the final CVI/CVD process may be configured to increase the wear life of the carbon/carbon brake disk.

10 Claims, 2 Drawing Sheets

(51) Int. Cl.
*C04B 41/00* (2006.01)
*F16D 65/12* (2006.01)
*F16D 65/02* (2006.01)

(52) U.S. Cl.
CPC .. *C04B 2235/6567* (2013.01); *F16D 2065/13* (2013.01); *Y10T 428/30* (2015.01)

(56) References Cited

U.S. PATENT DOCUMENTS

| | | |
|---|---|---|
| 8,268,207 B2 | 9/2012 | La Forest |
| 8,383,197 B2 | 2/2013 | La Forest |
| 8,801,981 B2 | 8/2014 | Fryska |
| 2010/0018815 A1 | 1/2010 | Murdie |
| 2011/0033623 A1 | 2/2011 | Fryska |

FOREIGN PATENT DOCUMENTS

| | | |
|---|---|---|
| CN | 102167325 | 8/2011 |
| EP | 2309147 | 4/2011 |
| EP | 2322818 | 5/2011 |
| GB | 2151221 | 7/1985 |

OTHER PUBLICATIONS

Extended European Search Report dated Feb. 8, 2017 in European Application No. 16176362.8.
European Patent Office, European Search Report dated Apr. 17, 2019 in Application No. 19150705.2.
European Patent Office, European Office Action dated Jan. 31, 2020 in Application No. 19150705.2.

SYSTEMS AND METHODS FOR PRODUCING A CARBON COMPOSITE MATERIAL

FIELD

The present disclosure relates to carbon composite material, and more specifically, to a system and method for manufacturing a C/C brake disk.

BACKGROUND

One method of manufacturing C/C materials involves fabrication of an oxidized polyacrylonitrile (PAN) or carbon fiber preform, followed by carbonization and chemical vapor infiltration (CVI) densification. Following the CVI densification, the C/C material may undergo a final heat treatment (FHT) process which may cause micro-cracking.

SUMMARY

A method of manufacturing a carbon/carbon brake disk is provided, in accordance with various embodiments. The method of manufacturing a carbon/carbon brake disk may comprise forming a fibrous network from an oxidized carbon fiber precursor, carbonizing the oxidized carbon fiber precursor by heating the oxidized carbon fiber precursor at 1400-2800° C. to form a carbon fiber, infiltrating the carbon fiber preform with carbon using CVI/CVD processing to increase the density of the preform to form a carbon/carbon (C/C) part, heating the C/C part, and performing a final chemical vapor deposition (CVD) process at approximately 1000° C. to at least partially fill in a micro-crack in the C/C part.

In a further embodiment of any of the foregoing embodiments, at least one of the infiltration, heating, and performing may be performed under a vacuum. In various embodiments, the heating the C/C part may be performed at a temperature in the range from about 1400° C. to about 2200° C. for a duration of about 4 hours to about 14 hours. In various embodiments, the performing the final chemical vapor deposition (CVD) process may be performed for a duration of about 20 to about 100 hours. In various embodiments, the performing the final CVD process may prevent at least one of oxygen, moisture, and oxidation protection systems (OPS) chemicals from penetrating the C/C part. In various embodiments, the performing the final CVD process may be configured to increase wear life of the carbon/carbon brake disk. In various embodiments, the infiltrating, heating, and performing may be done in a single furnace.

A carbon/carbon brake disk is provided, in accordance with various embodiments. The carbon/carbon brake disk may be made by a method comprising: forming a fibrous network from an oxidized carbon fiber precursor, carbonizing the oxidized carbon fiber precursor by heating the oxidized carbon fiber precursor at 1400-2800° C. to form a carbon fiber preform, infiltrating the carbon fiber preform with carbon using CVI/CVD processing to increase the density of the preform to form a carbon/carbon (C/C) part, heating the C/C part, and performing a final chemical vapor deposition (CVD) process at approximately 1000° C. to at least partially fill in a micro-crack in the C/C part.

In a further embodiment of any of the foregoing embodiments, at least one of the infiltration, heating, and performing may be performed under a vacuum. In various embodiments, the heating the C/C part may be performed at a temperature in the range from about 1400° C. to about 2200° C. for a duration of about 4 hours to about 14 hours. In various embodiments, the performing the final chemical vapor deposition (CVD) process may be performed for a duration of about 20 to about 100 hours. In various embodiments, the performing the final CVD process may prevent at least one of oxygen, moisture, and oxidation protection systems (OPS) chemicals from penetrating the C/C part. In various embodiments, the performing the final CVD process may be configured to increase wear life of the carbon/carbon brake disk. In various embodiments, the infiltrating, heating, and performing may be done in a single furnace.

A carbon/carbon part is provided, in accordance with various embodiments. The carbon/carbon (C/C) part may comprise a heat-treated portion and an un-heat-treated portion. The heat treated portion may comprise a C/C, wherein a micro-crack is disposed in the heat-treated portion. The un-heat-treated portion may comprise a carbon, wherein the un-heat-treated portion is located at least partially within the micro-crack, wherein the carbon is deposited via a chemical vapor deposition (CVD) process, wherein the CVD process is performed at a temperature of about 1,000° C. (1,832° F.) for a duration of about 20 hours to about 100 hours.

In a further embodiment of any of the foregoing embodiments, the heat treated portion may undergo a final heat treatment (FHT) process, according to various embodiments. In various embodiments, the FHT process may be performed at a temperature in the range from about 1400° C. to about 2200° C. (2,912° F. to about 3,992° F.) for a duration of about 4 hours to about 14 hours. In various embodiments, the micro-crack may be formed during the final heat treatment (FHT) process. In various embodiments, the un-heat-treated portion may be configured to prevent at least one of oxygen, moisture, and oxidation protection systems (OPS) chemicals from penetrating the C/C part. In various embodiments, the performing the chemical vapor deposition (CVD) process may be configured to increase the wear life of the C/C part. In various embodiments, the FHT process and the CVD process may be performed in a single furnace.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

Figure 1A:
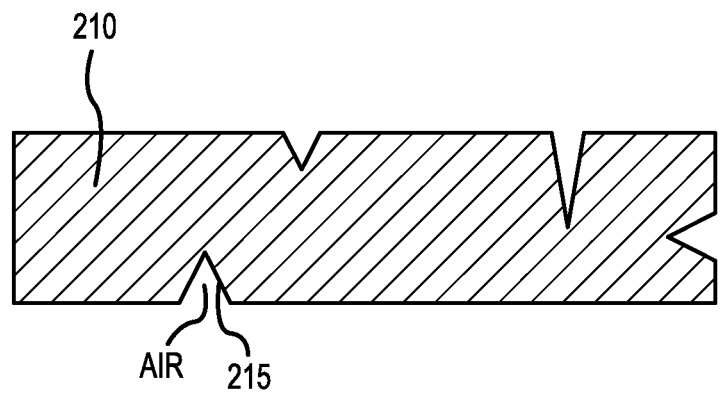
FIG. 1A illustrate a side view of a carbon/carbon (C/C) part having micro-cracks, in accordance with various embodiments.

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein. Thus, the detailed description herein is presented for purposes of illustration only and not of limitation. The scope of the disclosure is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step.

Carbon/carbon parts ("C/C") in the form of friction disks (also referred to as a carbon/carbon brake disks) are commonly used for aircraft brake disks, race car brakes, and clutch disks. Carbon/carbon brake disks are especially useful in these applications because of the superior high temperature characteristics of C/C material. In particular, the carbon/carbon material used in C/C parts is a good conductor of heat and is able to dissipate heat generated during braking away from the braking surfaces. Carbon/carbon material is also highly resistant to heat damage, and thus, is capable of sustaining friction between brake surfaces during severe braking without a significant reduction in the friction coefficient or mechanical failure. Furthermore, carbon/carbon brake disks are useful because they are relatively light weight, in particular in comparison to previous steel brakes.

One method of manufacturing C/C materials involves fabrication of an oxidized polyacrylonitrile (PAN) or carbon fiber preform, followed by carbonization and chemical vapor infiltration (CVI) densification. The CVI cycles are continued, in conjunction with machining the preform between infiltration cycles if desired, until the desired part density is achieved. In various embodiments, machining the surfaces of the preform may open surface porosity, thereby facilitating weight increases in the preform during subsequent densification steps.

In general, C/C parts produced using the OPF, carbonization, and CVI densification method are made in three successive manufacturing steps. First, a fibrous preform is made utilizing a variety of textile manufacturing techniques. Typically, the fibrous preform is made from OPF or carbon fiber. Although numerous techniques are known in the art for making fibrous preforms from OPF, a common technique involves stacking layers of OPF to superimpose the layers. The added layers may then be needled perpendicularly to the layers with barbed textile needles. The needing process generates a series of z-fibers through the fibrous preform that extend perpendicularly to the fibrous layers. The z-fibers are generated through the action of the needles pushing fibers from within the layer (x-y or in-plane) and reorienting them in the z-direction (through-thickness). Needling of the fibrous preform may be done as one or more layers are added to the stack or may be done after the entire stack is formed. The needles may also penetrate through only a portion of the preform or may penetrate through the entire preform. In addition, resins are sometimes added to the fibrous preform by either injecting the resin into the preform following construction or coating the fibers or layers prior to forming the fibrous preform. Fibrous preforms may also be made from pitch based carbon fiber tows and/or from rayon carbon fiber tows.

After the fibrous preform is made, it is carbonized to convert the OPF into carbon fibers in a process referred to herein as carbonization/graphitization. Typically, fibrous preforms are carbonized by placing the preforms in a furnace with an inert atmosphere. As is well-understood by those in the art, the heat of the furnace causes a chemical conversion which drives off the non-carbon chemicals from the preform. Carbonization/graphitization may be conducted in a vacuum or partial vacuum (e.g., at pressures of 1-15 torr) or in an inert atmosphere at a temperature in the range from about 1,400° C. to about 2,800° C. (2,552° F. to about 5,072° F.), and in various embodiments in the range from about 1,400° C. to about 2,500° C. (2,552° F. to about 4,532° F.), and in various embodiments in the range from about 1,400° C. to about 2,200° C. (2,552° F. to about 3,992° F.)(wherein the term about in this context only means +/−100° C.) for a period of time in the range of up to about 60 hours, and in various embodiments, in the range up to about 10 hours (wherein the term about in this context only means +/−2 hours). The resulting preform generally has the same fibrous structure as the fibrous preform before carbonizing. However, the OPF have been converted to 100% carbon or very near 100%, for example from 95% carbon to 99.9% carbon. The resulting preform may be referred to as having a fibrous network. In various embodiments, the preform may comprise an annular geometry.

After the preform has been carbonized, the preform is densified. In general, densification involves filling the voids, or pores, of the fibrous preform with additional carbon material. This may be done using the same furnace used for carbonization or a different furnace. Typically, chemical vapor infiltration and deposition ("CVI/CVD") techniques are used to densify the porous fibrous preform with a carbon matrix. This commonly involves heating the furnace and the carbonized preforms, and flowing hydrocarbon gases (e.g., at least one of methane, ethane, propane, butane, and/or the like, as described herein) into the furnace and around and through the fibrous preforms. The hydrocarbons may comprise alkanes, for example, straight chain, branched chain and/or cyclic alkanes, having from 1 to about 8 carbon atoms, and in various embodiments from 1 to about 6 carbon atoms, and in various embodiments from 1 to about 3 carbon atoms. Methane, ethane, propane, cyclopentane, or mixtures of two or more thereof may be used. The gas may comprise one or more alkanes of 2 to about 8 carbon atoms, and in various embodiments from 2 to about 6 carbon atoms. Mixtures of one or more alkanes of 1 to about 8 carbon atoms with one or more alkenes of 2 to about 8 carbon atoms may be used. In various embodiments, the CVI/CVD process may include a temperature gradient. In various embodiments, the CVI/CVD process may include a pressure gradient. As used herein, CVI/CVD may refer to chemical vapor infiltration or chemical vapor deposition. Accordingly, CVI/CVD may refer to chemical vapor infiltration or deposition.

CVI/CVD densification may be conducted in a vacuum or partial vacuum (e.g., at pressures of 1-15 torr) or in an inert atmosphere at a temperature in the range from about 900° C. to about 1100° C. (1,652° F. to about 1,832° F.), and in various embodiments in the range of up to about 1,000° C. (1,832° F.) (wherein the term about in this context only means +/−100° C.) for a period of time in the range from about 150 hours to about 550 hours, and in various embodiments, in the range from about 300 hours to about 500 hours (wherein the term about in this context only means +/−24 hours).

As a result, carbon from the hydrocarbon gases separates from the gases and is deposited on and within the fibrous preforms. Typically, the densification process is continued until the preform reaches a density in the range from 1.6 to 1.9 grams per cubic centimeter (g/cc), and in various embodiments, a density of approximately 1.75 g/cc. When the densification step is completed, the resulting C/C part has a carbon fiber structure with a carbon matrix infiltrating the fiber structure, thereby deriving the name "carbon/carbon."

Following the CVI/CVD densification process, the C/C part may undergo a final heat treatment (FHT) process. This may be done using the same furnace used for densification or a different furnace. If done using the same furnace, the flow of hydrocarbon gases would be stopped following the end of the densification process and the temperature increased. FHT may be conducted in a vacuum or partial vacuum (e.g., at pressures of 1-15 torr) or in an inert atmosphere at a temperature in the range from about 1200° C. to about 2600° C. (2,192° F. to about 4,712° F.), and in various embodiments in the range from about 1400° C. to about 2200° C. (2,552° F. to about 3,992° F.) (wherein the term about in this context only means +/−100° C.) for a period of time in the range from about 4 hours to about 14 hours, and in various embodiments, in the range from about 8 hours to about 12 hours (wherein the term about in this context only means +/−2 hours). The FHT process may decrease the hardness of the C/C part. In various embodiments, the FHT process may increase the coefficient of friction of the C/C part. In various embodiments, the FHT process may decrease the wear life of the C/C part.

With reference to FIG. 1A, as a result of the FHT process, micro-cracks, such as micro-crack 215, may form in the C/C part 210. In various embodiments, micro-cracks may allow moisture to reach the wear surface of the C/C part which may have a negative influence on the coefficient of friction of the C/C part. In various embodiments, micro-cracks may allow oxidation protection systems (OPS) chemicals to reach the wear surface of the C/C part which may have a negative influence on the coefficient of friction of the C/C part. In various embodiments, micro-cracks may lead to increased oxidation rate of the C/C part. In various embodiments, micro-cracks may lead to decreased friction performance of the C/C part. In various embodiments, micro-cracks may lead to decreased mechanical strengths of the C/C part. In various embodiments, micro-cracks may be infiltrated by air. In various embodiments, micro-cracks provide opportunity for moisture absorption and transfer of phosphate-based oxidation protection systems to the wear surfaces which may result in a reduction in friction performance. In various embodiments, micro-crack 215 may be disposed in C/C part 210 as illustrated in FIG. 1A.

Figure 1B:
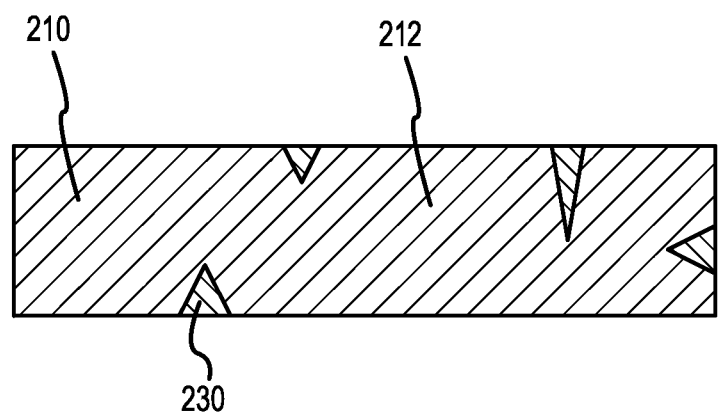
FIG. 1B illustrates a side view of a carbon/carbon (C/C) part having micro-cracks filled with un-heat-treated carbon, in accordance with various embodiments.

Following the FHT process, the C/C part 210 may undergo a final chemical vapor deposition CVD process. This may be done using the same furnace used for FHT or a different furnace. Thus, the FHT process and the final CVD process may be done in a single furnace. With further reference to FIG. 1B, the final CVD process may allow un-heat-treated carbon 230 to fill micro-cracks, such as micro-crack 215, in C/C part 210. In various embodiments, un-heat-treated carbon may be carbon that has not undergone the FHT process as previously described. The final CVD process may be similar to the densification process as previously described. The final CVD process may be conducted in a vacuum or partial vacuum (e.g., at pressures of 1-15 torr) or in an inert atmosphere at a temperature in the range from about 900° C. to about 1100° C. (1,652° F. to about 1,832° F.), and in various embodiments in the range of up to about 1,000° C. (1,832° F.) (wherein the term about in this context only means +/−100° C.) for a period of time in the range from about 20 hours to about 100 hours, and in various embodiments, in the range from about 30 hours to about 45 hours(wherein the term about in this context only means +/−2 hours). In various embodiments, the final CVD process may increase the density of C/C part 210. In various embodiments, the final CVD process may help seal the outer surface of C/C part 210, thereby preventing inhibitors, such as oxidation protection systems (OPS) for example, from penetrating too deeply into C/C part 210, e.g. into the wear surface, where the presence of inhibitors may degrade the friction performance of C/C part 210. In various embodiments, the final CVD process may include deposition of carbon onto a surface of C/C part 210, including a surface of micro cracks, such as micro-crack 215, thereby filling micro-cracks, such as micro-crack 215 with un-heat-treated carbon.

In various embodiments, the final CVD process may limit oxygen and/or moisture from penetrating C/C part 210. The reaction of water with an inhibitor may draw the inhibitor to the wear surfaces of a C/C brake disk during brake operation which can degrade the coefficient of friction of the C/C brake disk during operation. Thus, preventing moisture penetration may reduce this reaction. In various embodiments, un-heat-treated carbon 230 may comprise a lower coefficient of friction than heat-treated carbon. In various embodiments, un-heat-treated carbon 230 may be harder than heat-treated carbon and may thereby increase the life of the wear surface of a C/C brake disk. In various embodiments, a C/C brake disk that has undergone the final CVD process as described herein may comprise a decreased wear rate, thereby increasing the wear life of the C/C brake disk. In various embodiments, with reference to FIG. 1B, a C/C part that has undergone the final CVD process as described herein may comprise heat treated C/C 212. In various embodiments, heat-treated C/C 212 may comprise the C/C part 210 having undergone the FHT process as described herein. In various embodiments, heat-treated C/C 212 as described herein may be referred to as a heat-treated portion. In various embodiments, un-heat-treated carbon 230 as described herein may be referred to as an un-heat-treated portion.

The resulting C/C part may thus be referred to as a C/C brake disk. Thus, C/C part 210 may be a C/C brake disk, according to various embodiments. A C/C brake disk may be used in an aircraft braking system. In various embodiments, a brake disk may be used to reduce the speed of a wheel of an aircraft.

Figure 2:
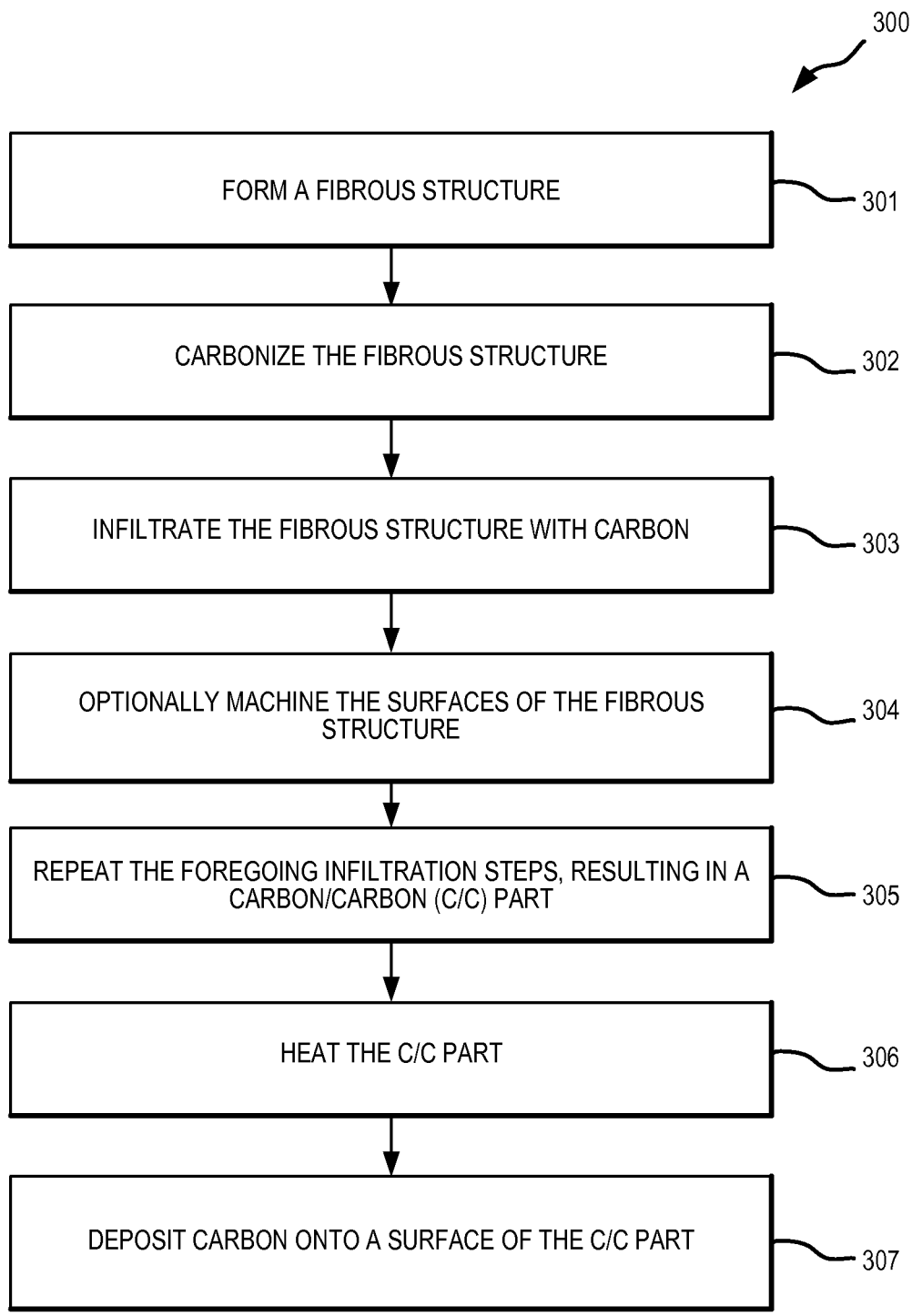
FIG. 2 illustrates method of manufacturing a carbon/carbon brake disk, in accordance with various embodiments.

With reference to FIG. 2, a method of manufacturing a carbon/carbon brake disk is described herein. The method 300 of manufacturing a carbon/carbon brake disk may comprise forming a fibrous structure in step 301. Step 302 may comprise carbonizing the fibrous structure. Step 303 may comprise infiltrating the fibrous structure with carbon. Step 304 may comprise optionally machining the surfaces of the fibrous structure. Step 305 may comprise repeating the foregoing infiltration steps, resulting in a carbon/carbon (C/C) part. Step 306 may comprise heating the C/C part. Step 307 may comprise depositing carbon onto a surface of the C/C part.

In various embodiments, step 301 may include forming a fibrous network from an oxidized carbon fiber precursor having undergone the needing process as previously described. Step 302 may include carbonizing the oxidized carbon fiber precursor by heating the oxidized carbon fiber precursor at 1400-2800° C. via a carbonization/graphitization process, as described herein, to form a carbon fiber preform. Step 303 may include infiltrating (densification) the carbon fiber preform with carbon using CVI/CVD processing to increase the density of the preform as previously described herein. Step 304 may include machining the surfaces of the carbon fiber preform of step 303 to open surface porosity after carbonization or CVI/CVD processing of step 303, thereby facilitating weight increases in the preform during subsequent densification steps. With reference to FIG. 1A and FIG. 1B, step 305 may include repeating the foregoing infiltration (densification) steps a sufficient number of times to achieve a final density in the preform of approximately 1.75 g/cc, resulting in carbon/carbon (C/C) part 210. Step 306 may include heating the C/C part at a temperature in a range from about 1400° C. to about 2200° C. for a duration of about 4-14 hours during the final heat treat (FHT) process as described herein. Step 307 may include performing the final CVD process on C/C part 210 at approximately 1000° C. for a duration of about 20-100 hours, as described herein, thereby filling in microcracks, such as micro-crack 215, in C/C part 210.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of manufacturing a carbon/carbon brake disk comprising:
   forming a fibrous network from an oxidized carbon fiber precursor; subsequently
   carbonizing the oxidized carbon fiber precursor in a furnace by heating the oxidized carbon fiber precursor at a first temperature in a first range of about 1,400° C. to 2,800° C. to form a carbon fiber preform; subsequently
   infiltrating the carbon fiber preform with carbon using chemical vapor infiltration or deposition (CVI/CVD) processing, by flowing at least one hydrocarbon gas into the furnace and by decreasing the first temperature in the furnace to a second temperature in a second range of about 900° C. to 1,100° C., to increase a density of the carbon fiber preform to form a carbon/carbon (C/C) part having a first portion with a first coefficient of friction; subsequently
   stopping the flow of the at least one hydrocarbon gas into the furnace; subsequently
   heat treating the C/C part, by increasing the second temperature in the furnace to a third temperature in a third range of about 1,200° C. to 2,600° C. to form a microscopic crack in the C/C part; and subsequently
   performing a final chemical vapor deposition (CVD) process after the heat treating the C/C part, by reducing the third temperature in the furnace to the second temperature in the second range of about 900° C. to 1,100° C. to at least partially fill in the microscopic crack in the C/C part with carbon having a second coefficient of friction different from the first coefficient of friction,
   wherein the C/C part includes the first portion comprising the first coefficient of friction and a second portion comprising the second coefficient of friction within the microscopic crack, and
   wherein the first portion comprises a first carbon that is heated between 900 to 1,100° C. and 1,200 to 2,600° C. and the second portion comprises a second carbon heated between 900 to 1,100° C. only.

2. The method of manufacturing the carbon/carbon brake disk of claim 1, wherein at least one of the infiltrating, heating, and performing are performed under a vacuum.

3. The method of manufacturing the carbon/carbon brake disk of claim 1, wherein the performing the subsequent final CVD process prevents at least one of oxygen, moisture, and oxidation protection systems chemicals from penetrating the C/C part.

4. The method of manufacturing the carbon/carbon brake disk of claim 1, wherein the performing the subsequent final CVD process is configured to increase wear life of the C/C part.

5. A carbon/carbon brake disk made by a method, comprising:
   forming a fibrous network from an oxidized carbon fiber precursor; subsequently carbonizing the oxidized carbon fiber precursor in a furnace by heating the oxidized carbon fiber precursor at a first temperature in a first range of about 1,400 to 2,800° C. to form a carbon fiber preform; subsequently infiltrating the carbon fiber preform with carbon using chemical vapor infiltration or deposition (CVI/CVD) processing, by flowing at least one hydrocarbon gas into the furnace and by decreasing the first temperature in the furnace to a second temperature in a second range of about 900° C. to 1,100° C., to increase a density of the carbon fiber preform to form a carbon/carbon (C/C) part having a first portion comprising a first coefficient of friction; subsequently;

stopping the flow of the at least one hydrocarbon gas into the furnace; subsequently heat treating the C/C part, by increasing the second temperature in the furnace to a third temperature in a third range of about 1,200 to 2,600° C. to form a microscopic crack in the C/C part; and subsequently performing a subsequent final chemical vapor deposition (CVD) process after the heat treating the C/C part, by reducing the third temperature in the furnace to the second temperature in the second range about 900 to 1,100° C. to at least partially fill in the microscopic crack in the C/C part with carbon having a second coefficient of friction different than the first coefficient of friction, wherein the C/C part includes the first portion comprising the first coefficient of friction and a second portion comprising the second coefficient of friction within the microscopic crack, and wherein the first portion comprises a first carbon that is heated between 900 to 1,100° C. and 1,200 to 2,600° C. and the second portion comprises a second carbon heated between 900 to 1,100° C. only.

6. The carbon/carbon brake disk of claim 5, wherein at least one of the infiltrating, heating, and performing are performed under a vacuum.

7. The carbon/carbon brake disk of claim 5, wherein the performing the subsequent final CVD process prevents at least one of oxygen, moisture, and oxidation protection systems chemicals from penetrating the C/C part.

8. The carbon/carbon brake disk of claim 5, wherein the performing the subsequent final CVD process is configured to increase wear life of the C/C part.

9. The method of manufacturing the carbon/carbon brake disk of claim 1, wherein the second coefficient of friction is lower than the first coefficient of friction.

10. The carbon/carbon brake disk of claim 5, wherein the second coefficient of friction is lower than the first coefficient of friction.

* * * * *